(12) United States Patent
Tai et al.

(10) Patent No.: US 7,160,633 B2
(45) Date of Patent: *Jan. 9, 2007

(54) STRUCTURE-DEFINING MATERIALS FOR OLEDS

(75) Inventors: Elizabeth Tai, Cupertino, CA (US); Matthias Stoessel, Mannheim (DE)

(73) Assignee: Osram Opto Semiconductors GmbH, Regensburg (DE)

(*) Notice: Subject to any disclaimer, the term of this patent is extended or adjusted under 35 U.S.C. 154(b) by 0 days.

This patent is subject to a terminal disclaimer.

(21) Appl. No.: 10/705,795

(22) Filed: Nov. 6, 2003

(65) Prior Publication Data

US 2004/0096697 A1 May 20, 2004

Related U.S. Application Data

(63) Continuation of application No. 09/910,066, filed on Jul. 20, 2001, now Pat. No. 6,656,611.

(51) Int. Cl.
 H01L 51/50 (2006.01)
 H05B 33/00 (2006.01)
 B05D 5/06 (2006.01)
 G03C 8/00 (2006.01)

(52) U.S. Cl. ............... 428/690; 428/917; 428/131; 428/447; 428/448; 427/66; 257/88; 313/509; 430/199

(58) Field of Classification Search ......... 428/690, 428/917, 131, 447, 448; 427/66; 257/88; 313/509; 430/199
See application file for complete search history.

(56) References Cited

U.S. PATENT DOCUMENTS

| 5,276,380 | A | 1/1994 | Tang | |
|---|---|---|---|---|
| 6,320,311 | B1* | 11/2001 | Nakaya et al. | 313/506 |
| 6,399,210 | B1* | 6/2002 | Zhong | 428/447 |
| 6,656,611 | B1* | 12/2003 | Tai et al. | 428/690 |
| 2001/0019133 | A1* | 9/2001 | Konuma et al. | 257/79 |
| 2001/0022497 | A1* | 9/2001 | Aoki et al. | 313/507 |

FOREIGN PATENT DOCUMENTS

| EP | 0910128 | 4/1999 |
|---|---|---|
| WO | WO 98/02019 | 1/1998 |

* cited by examiner

*Primary Examiner*—Dawn Garrett
(74) *Attorney, Agent, or Firm*—Fish & Richardson P.C.

(57) ABSTRACT

Poly-siloxane material may be used to form an insulating structure in an organic light-emitting device (OLED). In addition to the insulating structure, an OLED may have an electro-luminescent organic layer separated into light-emitting elements, e.g., display pixels, arranged between electrode layers. A voltage applied across the electrode layers causes the device to emit light. One type of insulating structure may be a bank structure formed from a thin sheet of poly-siloxane with apertures corresponding to the display pixels. Pixels may be formed with the deposit of one or more layers of organic material into the apertures. Another type of-insulating structure may be one or more insulating strips, which may separate an electrode layer into electrode strips during construction and/or insulate electrode strips while the OLED is in operation.

25 Claims, 7 Drawing Sheets

STRUCTURE-DEFINING MATERIALS FOR OLEDS

CROSS-REFERENCE TO RELATED APPLICATIONS

Figure 1:
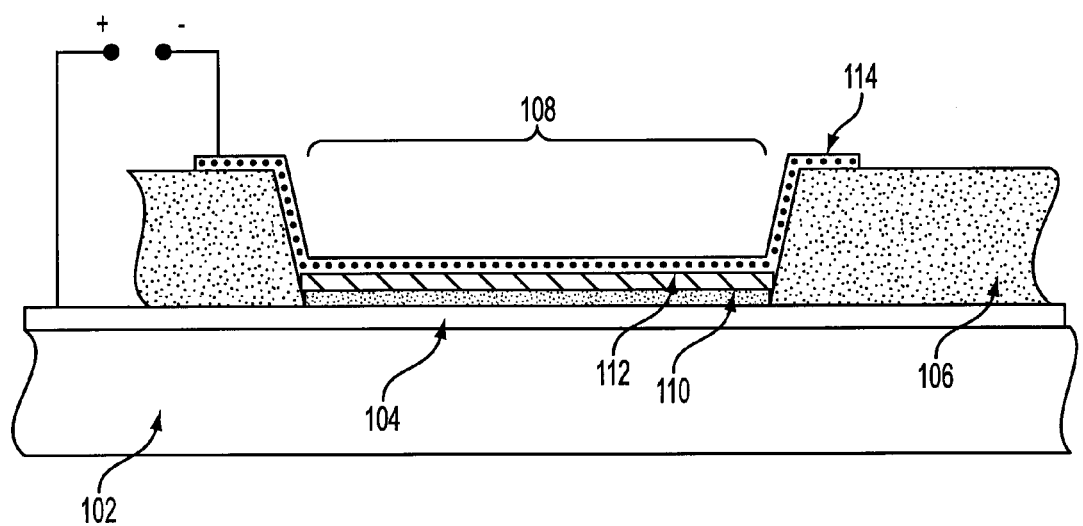

This application is a continuation of application Ser. No. 09/910,066 filed Jul. 20, 2001 and entitled "Structure-Defining Materials for OLEDs" which issued as U.S. Pat. No. 6,656,611.

BACKGROUND

The present application relates to a structure-defining material for organic light-emitting devices (OLEDs). OLEDs use electro-luminescent organic materials, for example, to provide lighting elements for display devices. OLEDs may be designed to replace conventional non-organic display technologies or for new applications.

A typical OLED display device has a "sandwich" or layered construction. To construct a typical OLED, first, a transparent conducting layer is deposited onto a transparent substrate. The transparent conducting layer typically comprises a transparent conducting oxide material, e.g., indium-tin oxide (ITO). Other materials, including thin metal films, alternatively may be used for the transparent conducting layer. The transparent conductive layer may serve as one of the electrode layers (typically the anode) of the OLED. Next, a set of one or more organic layers is deposited onto the transparent conducting layer. The depositing techniques used may depend on the types of organic material deposited. The organic layers may serve various functions such as hole injecting, hole transporting, electron injecting, electron transporting, and/or as emitting or intermediate layers. Finally, one or more conducting layers are deposited and may serve as another electrode layer (typically the cathode) of the OLED device. Typically, this second electrode layer has a sub-layer formed of a low work function metal (e.g., Ca, Mg, Ba or Li), and a capping sub-layer of a more air-stable high work-function metal (e.g. Ag or Al). Other types of material for the second electrode layer, such as metal alloys or combinations of insulating and metal sub-layers, may be used.

In operation, a voltage is applied across the electrode layers, charge carriers are injected into the organic layers, recombination takes place, and part of the recombination energy leaves the device as photons. The photons pass through the transparent first electrode layer and substrate and are visible as emitted light.

SUMMARY

The present inventors recognized that using poly-siloxane as a structure-defining material for one or more separator or insulating structures in an OLED (e.g. a bank structure for pixel confinement, insulating strips for isolating electrodes, etc.) results in dramatic improvements in manufacturing yield, ease and cost, as well as improved reliability and lifetime of the OLED. Consequently, the present inventors developed OLEDs having poly-siloxane insulating structures and corresponding manufacturing techniques.

In one implementation, a light-emitting device may include a plurality of electrode layers, including an anode layer and a cathode layer, an electro-luminescent organic layer disposed between the anode and cathode layers, and a poly-siloxane insulating structure separating the electro-luminescent organic layer into a plurality of light-emitting elements. In addition, the light-emitting device may include at least one other organic layer disposed adjacent to the electro-luminescent organic layer. In that case, the at least one other organic layer may be configured to perform one or more of the following functions: hole injection, hole transportation, electron injection, and electron transportation. The poly-siloxane insulating structure, which may separate the electro-luminescent layer into a plurality of pixels, may be a thin sheet of poly-siloxane material having a plurality of apertures. Each of the anode layer and cathode layer may include a plurality of electrode strips arranged such that anode layer electrode strips and the cathode layer electrode strips coincide at regions corresponding to apertures of the poly-siloxane insulating structure. The at least one electrode layer may be configured to independently address each aperture of the poly-siloxane insulating structure as a display pixel, and wherein the at least one electrode layer is further arranged in an active matrix configuration. The poly-siloxane insulating structure may form a bank structure that insulates the plurality of light-emitting elements from each other. The light emitting device further may include one or more insulating strips on the poly-siloxane insulating structure, wherein at least one insulating strip includes an overhanging portion or a base portion or both, either or both of which may be formed of poly-siloxane material in one or both of the overhanging portion and the base portion.

In another implementation, a method of constructing a light-emitting device may include forming a first electrode layer on a substrate, forming on the first electrode layer a poly-siloxane bank structure having apertures, depositing one or more organic layers into the apertures of the poly-siloxane bank structure, and forming a second electrode layer such that the one or more organic layers deposited into the apertures are disposed between the first and second electrode layers. Depositing one or more organic layers may include depositing an electro-luminescent organic layer. Alternatively, or in addition, depositing one or more organic layers may include depositing at least one other organic layer (e.g., a conductive polymer layer) disposed adjacent to the electro-luminescent organic layer. In that case, the at least one other organic layer may be an organic layer configured to perform one or more of the following functions: hole injection, hole transportation, electron injection, and electron transportation. The method further may include patterning the poly-siloxane bank structure to separate the light-emitting device into a plurality of pixels. Forming the poly-siloxane bank structure may include forming a thin sheet of poly-siloxane material having a plurality of apertures, each aperture corresponding to an individual light-emitting element. Each of the first electrode layer and the second layer may be formed as a plurality of electrode strips arranged such that the first electrode layer strips coincide with the second electrode layer strips at regions corresponding to the poly-siloxane bank structure's apertures. Forming the first electrode layer further may include arranging the first electrode layer to independently address each aperture of the poly-siloxane bank structure. Arranging the first electrode layer further may include configuring the first electrode layer as an active matrix. Depositing the one or more organic layers may include one or more of spin-casting, dip-coating, screen printing, flexo printing, and ink-jet printing. The poly-siloxane bank structure may be formed before the one or more organic layers are deposited. Or one or more organic layers may be deposited before the poly-siloxane bank structure is formed. The method further may include forming one or more insulating strips on the poly-siloxane bank structure, for example, between apertures. At least one insulating strip may include an overhanging portion or a base portion or both, either or both of which may be formed of poly-siloxane in whole or part.

In another implementation, an organic light-emitting device (OLED) may include a plurality of light-emitting elements, each light-emitting element comprising an electro-luminescent material disposed between electrode elements, and at least one structure comprising poly-siloxane material, wherein the structure is configured to separate elements of the OLED. The at least one structure may be a poly-siloxane bank structure configured to separate light-emitting elements from each other, and may include apertures into which light-emitting elements are arranged. The poly-siloxane bank structure may physically and electrically insulate the light-emitting elements from each other. The OLED further may include one or more insulating strips configured to separate electrode elements of the OLED. The at least one insulating strip may include an overhanging portion or a base portion or both, either or both of which may be formed of poly-siloxane in whole or part. Alternatively, the at least one structure may be one or more insulating strips configured to separate electrode elements of the OLED. The at least one insulating strip may insulate neighboring electrode elements from each other.

One or more of the following advantages may be provided. The use of a poly-siloxane insulating structure may result in lower manufacturing cost since poly-siloxane can be processed from solution. Moreover, in forming the insulating structures, poly-siloxane may be directly patterned using photo-lithographic techniques, which may reduce cost, time and the number of flaws introduced in manufacturing as compared to indirect photo-patterning processes. The resulting poly-siloxane insulating structures may retain less of harmful reactive chemicals or water than the processing of insulating structures made of other materials, so that the reliability and lifetime of the OLED may be improved. Because poly-siloxane exhibits non-wetting behavior with respect to many solutions that are used to deposit organic materials in the OLED, the use of poly-siloxane as a structure-defining material may help contain other fabrication materials in their desired locations within the OLED and thus prevent undesirable electrical bridging and other manufacturing flaws. Furthermore, poly-siloxane can be cured at temperatures that are compatible with other materials used in the OLED, thus avoiding damage to the OLED components.

Details of one or more embodiments are set forth in the accompanying drawings and the description below. Other features, objects, and advantages will be apparent from the description and drawings, and from the claims.

DRAWING DESCRIPTIONS

FIG. 1 is a cross-sectional view of an OLED having a poly-siloxane bank structure.

Figure 2A:
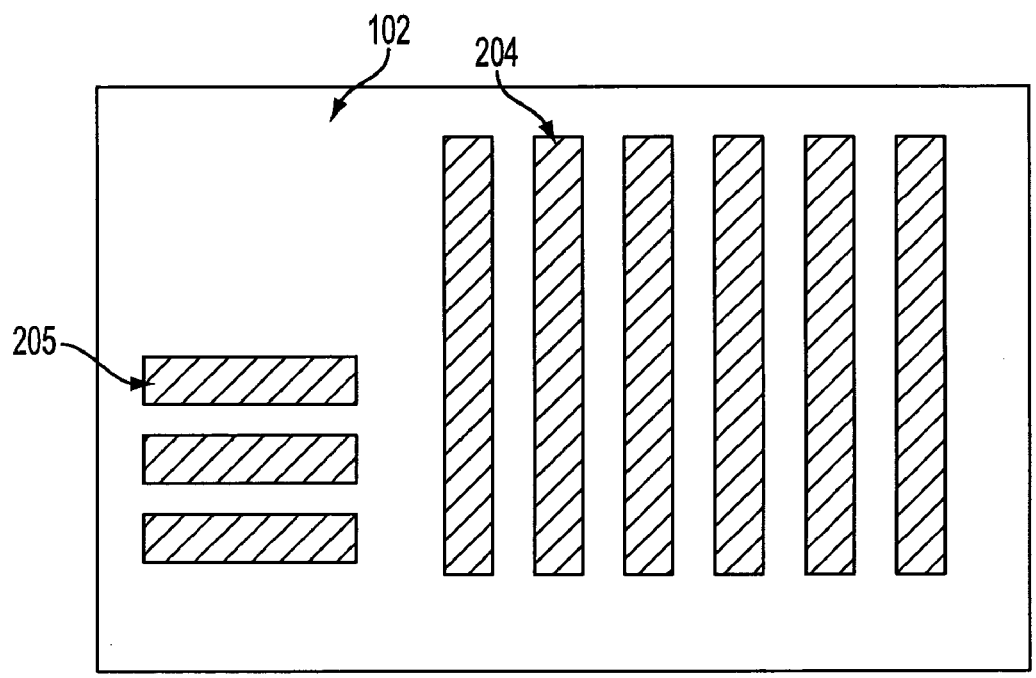
Figure 2B:
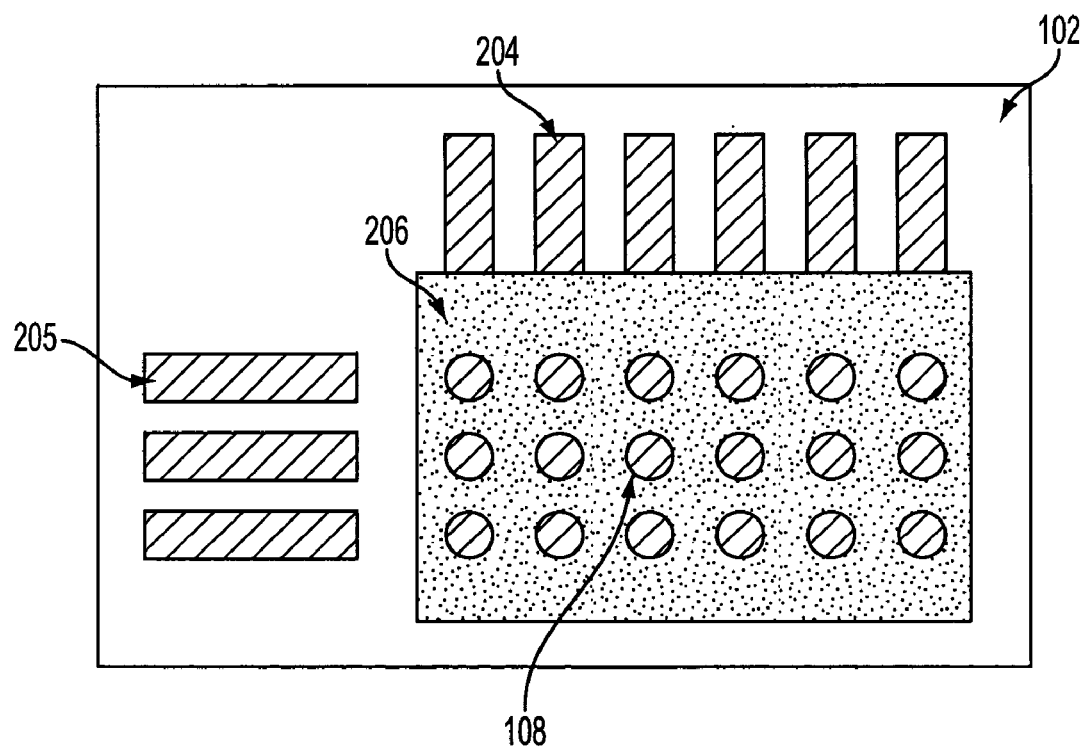
Figure 2C:
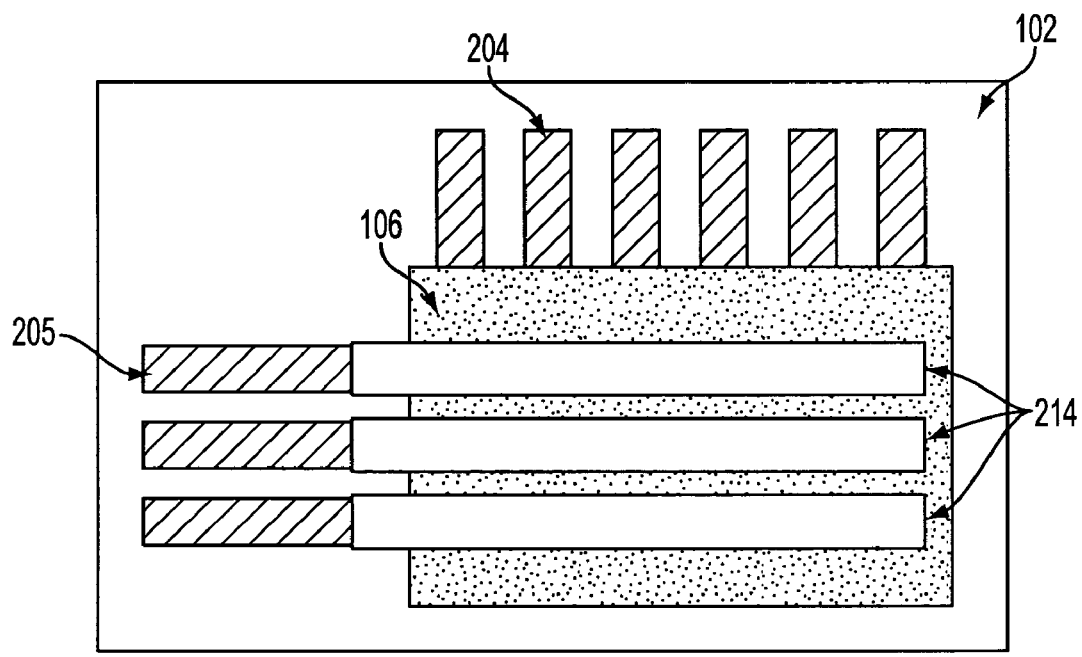

FIGS. 2A–C are overhead views depicting the construction of an OLED having a poly-siloxane bank structure.

FIGS. 3A–D are views depicting the construction of an OLED having overhanging insulating strips.

Figure 4A:
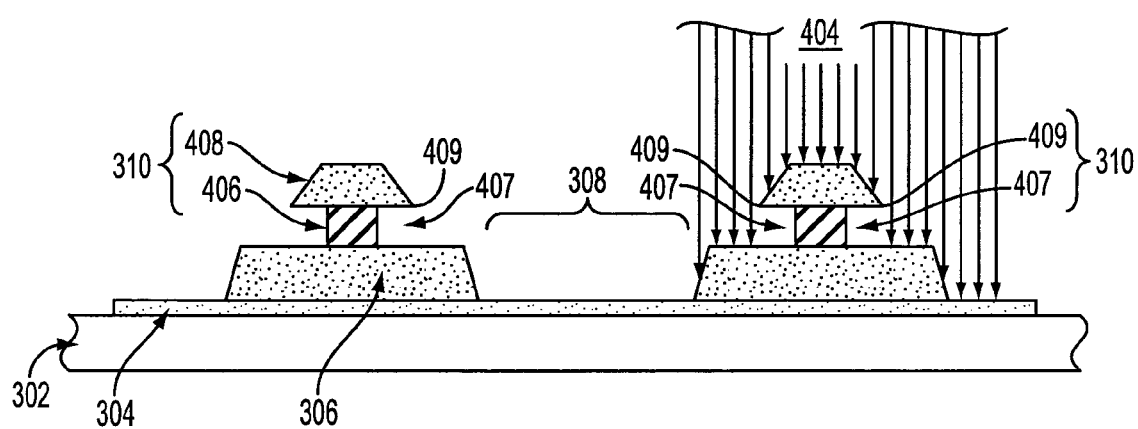
Figure 4B:
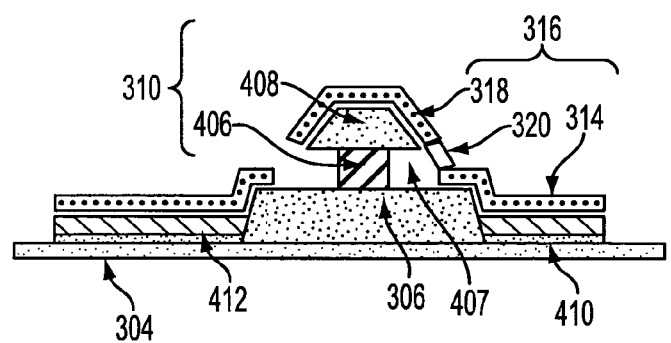

FIGS. 4A–B are cross-sectional views depicting overhanging insulating strips.

Figure 5:
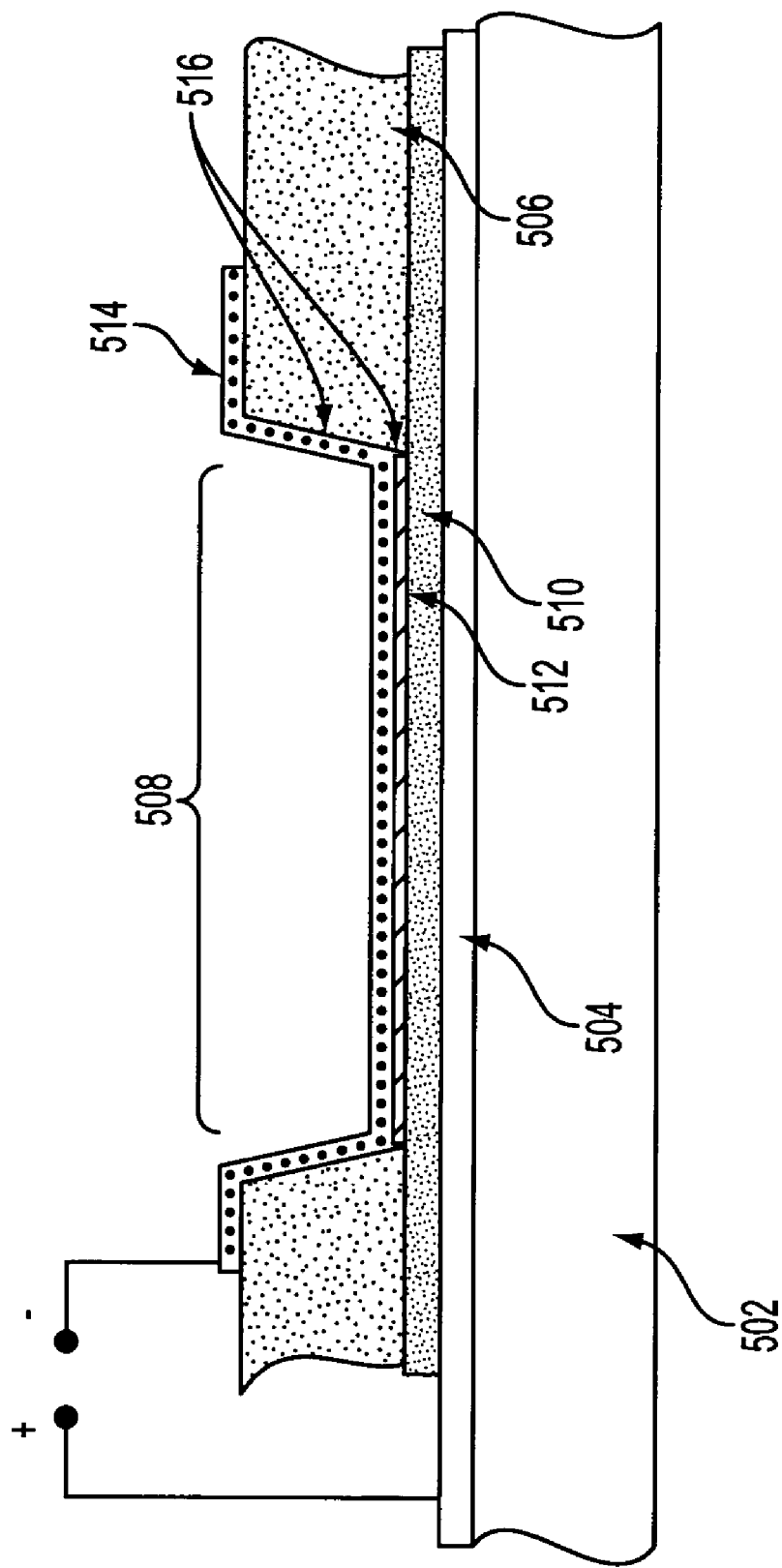

FIG. 5. is a cross-sectional view showing an alternative construction of an OLED having a poly-siloxane bank structure.

DETAILED DESCRIPTION

OLEDs typically include one or more insulating structures for electrically or physically insulating elements of the OLED. The term "elements" in this description refers to physical regions of one or more layers that may function independently of other regions. For example, organic layers may be arranged in a pattern of display pixels that are elements that must be electrically isolated from one another. As another example, the first and second electrode layers may be arranged in a pattern of electrode elements such that each pixel may be independently excited by an electrical current. The electrode elements may be implemented as electrode strips that are electrically isolated from each other.

FIG. 1 is a cross-sectional view of an OLED having a poly-siloxane bank structure 106. To construct the OLED, a substrate 102, such as glass or quartz may be coated with a conducting material, such as indium-doped tin oxide (ITO), serving as a first electrode layer 104. Alternative constructions of an OLED include substrates of plastic such as polyethyleneterephthalate (PET) or polyethylenenapthalate (PEN).

On top of this first electrode layer, the insulating bank structure 106 may be formed from poly-siloxane material. The bank structure 106 may be a thin sheet of poly-siloxane material with apertures 108 though which the layer underneath is exposed. Next, a first organic layer 110 and a second organic layer 112 may be deposited as layers of the OLED. Then, the second electrode layer 114 may be applied to the OLED. Additionally, for protecting the device from oxygen and moisture, an encapsulation or sealing that envelops the device may be applied (not shown).

The OLED may be operated to emit light by applying a voltage across the first and second electrode layers. Typically, the first electrode layer 104 serves as an anode layer and the second electrode layer 114 serves as a cathode layer. Other arrangements, such as using the first electrode layer as a cathode and the second electrode layer as an anode, are possible.

In the OLED of FIG. 1, the substrate 102 and first electrode layer are made of transparent materials, such as glass and ITO, which allow emitted light to pass through them. Opaque materials may be used for the substrate and/or first electrode layer in alternative OLED constructions that allow the emitted light to pass though a transparent second electrode layer, and do not emit light through the substrate material.

At least one of the organic layers 110 or 112 is electro-luminescent. In accordance with the construction described for FIG. 1, the electro-luminescent layer is disposed between the electrode layers. Thus, light-emitting elements are created as display pixels in the apertures 108. of the poly-siloxane bank structure 106. Thus, each aperture 108 in the bank structure 106 may correspond to a light-emitting element, and the bank structure 106 may operate as an insulating structure separating the electro-luminescent organic layer into light-emitting elements.

FIG. 1 illustrates another organic layer disposed adjacent to the electro-luminescent organic layer. Alternative arrangements are possible, such a single electro-luminescent layer, or multiple organic layers. Each organic layer may be configured to perform one or more functions such as hole injecting, hole transporting, electron injecting, electron transporting, and/or as electro-luminescent (emitting) or intermediate layers.

A variety of thickness values are possible for the organic layers, electrode layers, and insulting structures. The thickness value determines the thickness or thinness of the layer or structure in terms of its vertical height. The thickness value of each layer or insulating structure may be in the range between 10 nanometers to 20 microns, and commonly is in the range between 50 nanometers to 20 microns.

FIGS. 2A–C are overhead views showing details of the constructing an OLED having a poly-siloxane bank structure.

FIG. 2A is an overhead view showing construction of the first electrode layer. The first electrode layer may be patterned as a plurality of electrode elements that may include first electrode strips 204 on the substrate 102. Patterning of the first electrode strips may be accomplished, for example, using photolithographic techniques. Alternative patterns for the electrodes are possible. Contact leads 205 may be patterned from the first electrode layer for later connection to the second electrode layer.

FIG. 2B shows the addition of the poly-siloxane insulating bank structure 106 with apertures 108 exposing the layer underneath. The apertures are positioned to align with the first electrode strips 204. The bank structure 106 may be formed using a conventional photolithographic process which may include spin-casting of poly-siloxane material from solution, pre-baking to reduce the solution, exposing the reduced poly-siloxane material to UV-light, development according to the UV-light exposure using commercially available developer solution, and final curing of the poly-siloxane material.

In this disclosure, the term poly-siloxane includes directly photo-patternable poly-siloxanes. For example, such directly photo-patternable poly-siloxane material is commercially available from Shin Etsu Chemical Co., Ltd, in their Shin Etsu Photo-Sensitive Silicone Dielectrics (SINR) series. The products in the SINR series are siloxane-modified hydrocarbon structures. One product in this series is SINR-3010.

Poly-siloxane may be advantageous as an insulating bank structure material, among other reasons, in that it can be processed from solution, whereas inorganic materials, such as $SiO_2$, typically require expensive and time-consuming vacuum depositing processes such as thermal evaporation, electron-beam evaporation or sputtering.

In order to make the apertures 108, the insulating bank material generally must be patternable. A further advantage of poly-siloxane material is that it may be directly photo-patternable. Conventional insulating structures typically are patterned using indirect photolithographic processes. One such indirect process is a photo-resist lift-off process, in which prior to deposition of the insulating material, portions of the substrate that are not meant to be covered by the insulating material are covered with photo-resists. After deposition of the insulating materials, the photo-resist is dissolved. Another conventional approach is to cover the substrate with insulating material, and chemically etch the insulating material where it is not wanted. These indirect processes tend to be technically difficult, time-consuming and may introduce device flaws. In contrast, portions of the poly-siloxane insulating structure exposed to a suitable amount of UV light are directly cured, in a manner similar to negative photo-resists, eliminating the need for etching or lift-off processes. As a result, constructing OLED bank structures from poly-siloxane dramatically simplifies the patterning process Following the deposition of the poly-siloxane insulating bank structure 106, virtually any desired number of organic layers (e.g. one or more) may be deposited in the apertures, forming display pixel elements as described for FIG. 1. In the OLED depicted in FIG. 1, two organic layers are shown at 110 and 112. The first organic layer 110 may be a conductive polymer, for example, from the class of polyanilines or polythiophenes. An example of such a conductive polythiophene polymer is polyethylene di-oxythiophene doped with polystyrene-sulphonic acid (PEDOT), commercially available as polymer solution from Bayer AG, Germany (for example under the trade-names of Baytron or Baytron-P). The first organic layer 110 may be deposited from a water-based solution or dispersion. The second organic layer 112 may be an electro-luminescent polymer, and may be deposited from a solution based on a non-polar solvent. The use of a non-polar solvent prevents the second solution from dissolving the previously deposited layer.

Alternatively, any number of organic layers 110, 112 may be comprised of polymers or oligomers or small functional molecules. The layers may be deposited from solution by wet-chemical techniques which including spin-casting from solution, dip-coating, and printing techniques such as screen printing, flexo printing or ink-jet printing. Printing may be patterned to distribute the organic materials into the apertures 108 in the bank structure 106. With printing techniques, several types of organic material may be applied simultaneously, such as polymers with different emission colors, producing multi-color displays. Other ways of producing a polymer film as an organic layer may include electrochemical polymerization and in-situ polymerization of monomers that have been deposited on the substrate by evaporation techniques. Small functional molecules may be deposited either in a vacuum-process (e.g. thermal evaporation) or, like polymers, in a wet chemical process from solution.

After curing, poly-siloxane insulating structures advantageously exhibit non-wetting behavior with both aqueous water-based solutions and with non-polar organic solutions. Thus, when poly-siloxane is used to form the bank structure 106, a water-based solution for depositing an organic layer such as 110 or a non-polar solution for depositing an organic layer such as 112 will tend to be strictly confined to the apertures 108 of the bank structure 106. Electrical bridging between one aperture 108 and another aperture caused by wetting of the bank structure 106 with spin-cast solution, as often happens with conventional bank structure materials, is therefore less likely. Non-wetting behavior of poly-siloxanes and other materials may be enhanced using wet-chemical, gas or plasma treatments. Poly-siloxane may exhibit sufficiently advantageous non-wetting behavior without additional surface treatment of the insulating bank structure.

The non-wetting character of the poly-siloxane also may be advantageous in combination with the ink jet printing technique for depositing organic layers 110, 112 from solution. Ink-jet printing may be patterned to deposit organic material by placing droplets of solution into the centers of the apertures 108 of the bank structure 106. Poor droplet placement accuracy in the printing process may result in droplets being misplaced in the aperture 108 or spreading onto the surface of the bank structure 106. The non-wetting behavior of the poly-siloxane bank structure 106 may repel a droplet to the desired position in the open windows 108. Thus, the poly-siloxane bank structure 106 helps prevent spreading of solution into neighboring apertures 108 and intermixing of different types of organic material that may be applied simultaneously, such as polymers with different emission colors. The poor wetting behavior of the poly-siloxane bank structure 106 also may help prevent residual organic material from clinging to the sides of the aperture 108, which reduces the likelihood that layers deposited later will be short-circuited or that a display pixel will have poor performance.

FIG. 2C shows the addition of the second electrode layer in constructing the OLED. After deposition of the one or more organic layers, the second electrode layer 114 may be applied by vacuum deposition techniques such as thermal evaporation or sputtering. The second electrode layer 114 may have sub-layers of one or more metals. The second electrode layer 114 may be patterned as a plurality of electrode elements such as second electrode strips 214 running substantially perpendicular to the first electrode strips 204, making contact with the contact leads 205 and aligned with the apertures 108. The electrode strips are thereby arranged such that the second electrode strips 214 coincide with the first electrode strips 204 at regions corresponding to the apertures 108 of the poly-siloxane bank structure 106. Typically, the first electrode strips 204 may serve as anode layer electrode strips and the second electrode strips 214 may serve as cathode layer electrode strips. According to this arrangement, actuating one first electrode strip 204 as an anode and one second electrode strip 214 as a cathode will electrically excite one aperture 108 as a display pixel. Alternative patterns, shapes and arrangements of the apertures and electrode strips are possible. Alternative groupings of the electrode strips into anodes and cathodes are also possible. Additionally, for protecting the device from oxygen and moisture, an encapsulation or sealing may be applied (not shown).

In the OLED shown in FIG. 2, second electrode strips 214 may be arranged to coincide with first electrode strips 204 at apertures 108 where display pixel may be formed, such that each pixel may be separately excited by an electrical current. Alternative arrangements may allow each display pixel to be separately excited without patterning of the second electrode layer into strips. To accomplish this, the first electrode layer may be configured to independently address each aperture of the poly-siloxane bank structure as a display pixel. For example, the first electrode layer may be patterned with a separate electrical line for each pixel. Alternatively, the first electrode layer may be patterned in an active matrix configuration, for example, with a transistor structure associated with each display pixel. These arrangements may allow the pixels to be individually selected by electrical circuits in the first layer, while sharing the second electrode layer as a common electrode. Thus, the effort of patterning the second electrode layer may be eliminated. The insulating structure and polymer layers of such an alternative OLED may be arranged as described for FIG. 1 and FIG. 2, including, for example, the possibility of ink-jet printing organic layer material into the apertures of the poly-siloxane bank structure.

The present inventors recognized that, for a variety of reasons, poly-siloxane is preferable to other directly photo-paternable insulating materials, such as poly-imides, in constructing OLEDs. Unlike many semiconductor devices, OLEDs retain the insulating materials as part of the device in operation. Consequently OLEDs containing poly-imides may retain highly reactive components used in processing the poly-imides, such as solvents, photo-generated acids, cross-linkers, photo-generators and photo-initiators. A potential advantage of poly-siloxane material is that less reactive material is used in processing, so that less reactive material is retained in the OLED. Furthermore, poly-siloxanes contain relatively few polar groups where water can be implemented. Thus the water uptake of a poly-siloxane insulating structure is relatively low (approximately 0.2–0.3%, as opposed to approximately 2–3% for polyimides). Consequently a poly-siloxane insulating structure releases very little water into the active organic layers of the OLED during operation. As OLED devices tend to be highly sensitive to moisture and reactive chemicals, the use of poly-siloxanes, instead of conventional photo-resists or poly-imides, for insulating structures has a positive effect on lifetime and efficiency of an OLED using poly-siloxane as a structure-defining material.

A further potential advantage of using poly-siloxane as a structure-defining material in OLED construction is that the curing temperature of poly-siloxane insulating structures are typically below 250° C., often in the range 210+/−30° C., and may be in the range 210+/−15° C. These relatively moderate curing temperatures for poly-siloxane are compatible with most of the substrate materials used in display technologies, for example, glass, and generally do not negatively affect the properties of typical electrode-forming material, such as ITO.

Figure 3A:
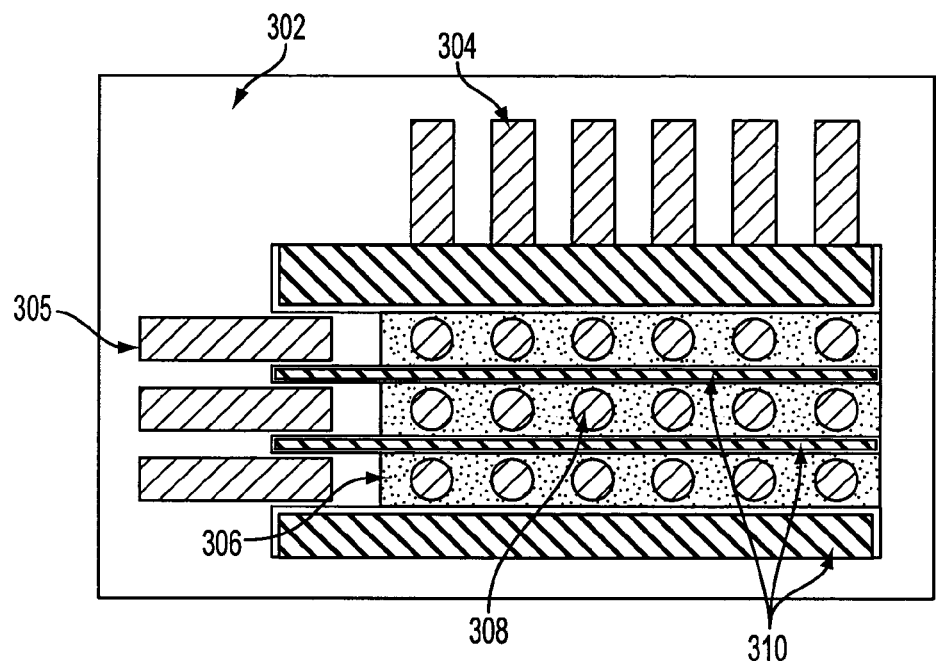

FIGS. 3A–D shows an alternative OLED construction using poly-siloxane insulating strips. The first electrode strips 304, electrode leads 305 and the insulating bank structure 306 are deposited on the substrate 302 as previously discussed with regard to FIG. 2B. Referring to FIG. 3A, insulating strips 310 formed of poly-siloxane may then be deposited onto the bank structure 306 between apertures 308. The poly-siloxane insulating strips may be formed using the same techniques for forming the poly-siloxane insulating bank structure as previously described with regard to FIG. 2B.

Figure 3B:
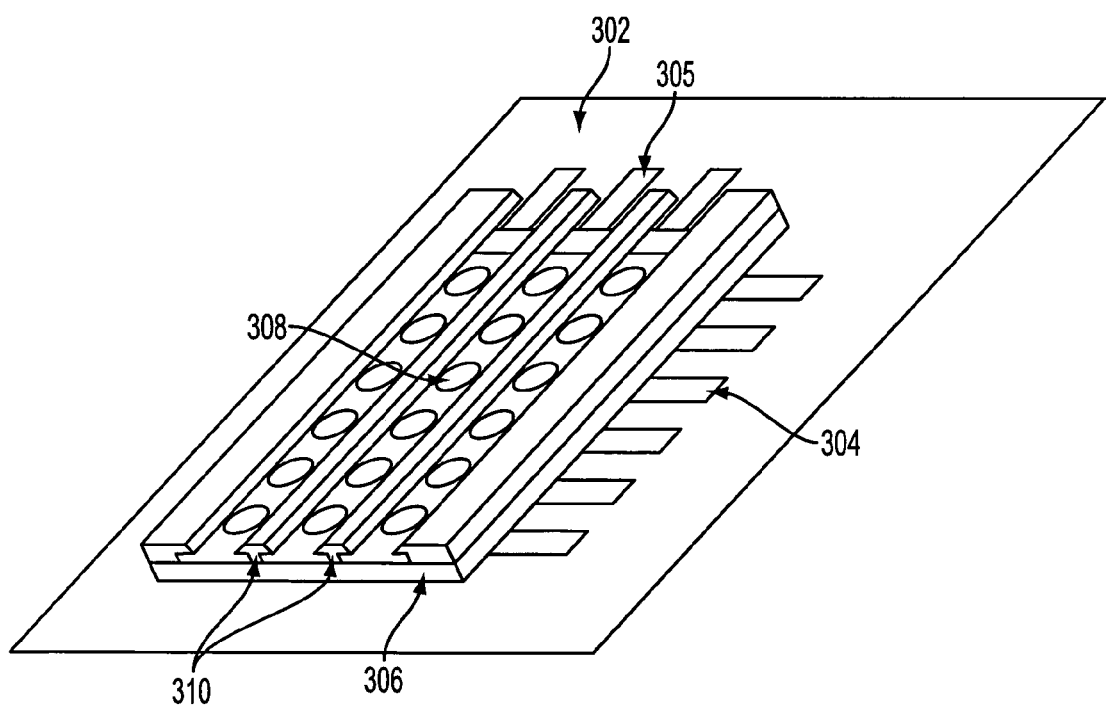

FIG. 3B is a perspective view corresponding to FIG. 3A, showing the insulating strips 310 running the length of the bank structure 306 between apertures 308 and adjacent contact leads 305. The organic layers may be deposited into the apertures 308 before or after the insulating strips are deposited, using spin-casting or printing techniques, for example.

Figure 3C:
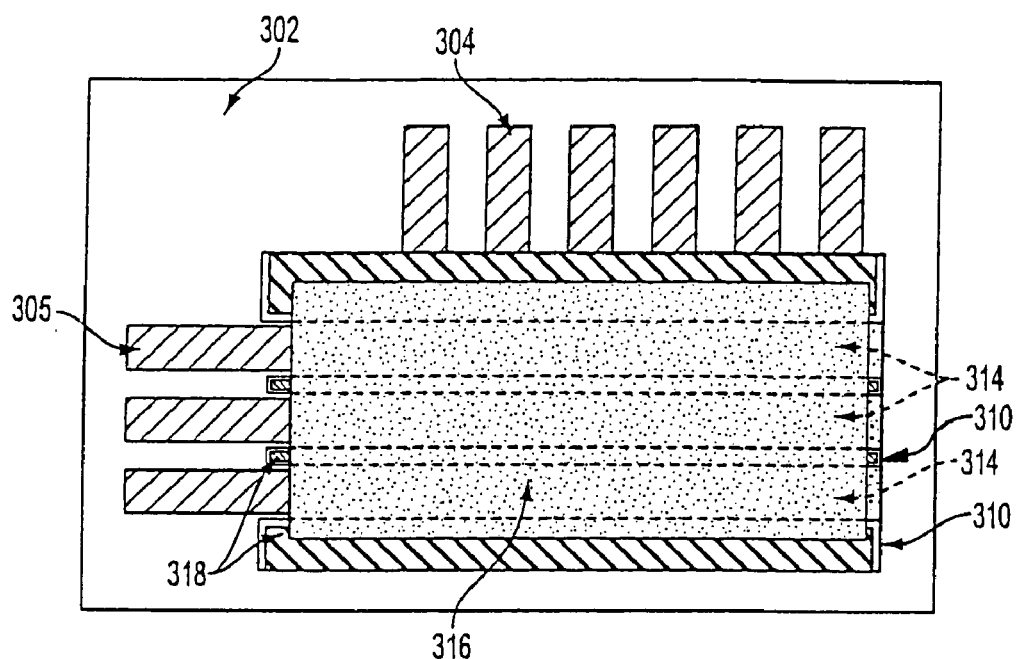

Next, the second electrode layer 316 is deposited as shown in FIG. 3C. The second electrode layer may be comprised of electrode strips 314 and waste material 318 between the second electrode strips 314. As the second electrode layer 316 is deposited, the waste material 318 may come to rest at a higher elevation on the tops of the insulating strips 310, whereas the second electrode strips 314 may be formed of material coming to rest at a lower elevation between the insulating strips 310. The second electrode strips 314 may therefore be electrically isolated from the waste material 318 and each other. Thus, the second electrode layer 316 may be patterned into electrode strips 314 as it is deposited, due to the arrangement of the insulating strips 310. Consequently, the second electrode strips 314 may be formed without having to use expensive lithographic or printing techniques. Alternatively, the insulating strips 310 may aid the separation of other layers into separate elements of the OLED. For example, the insulating strips 310 may aid the separation of organic layers that are deposited after the construction of the insulating strips 310.

Figure 3D:
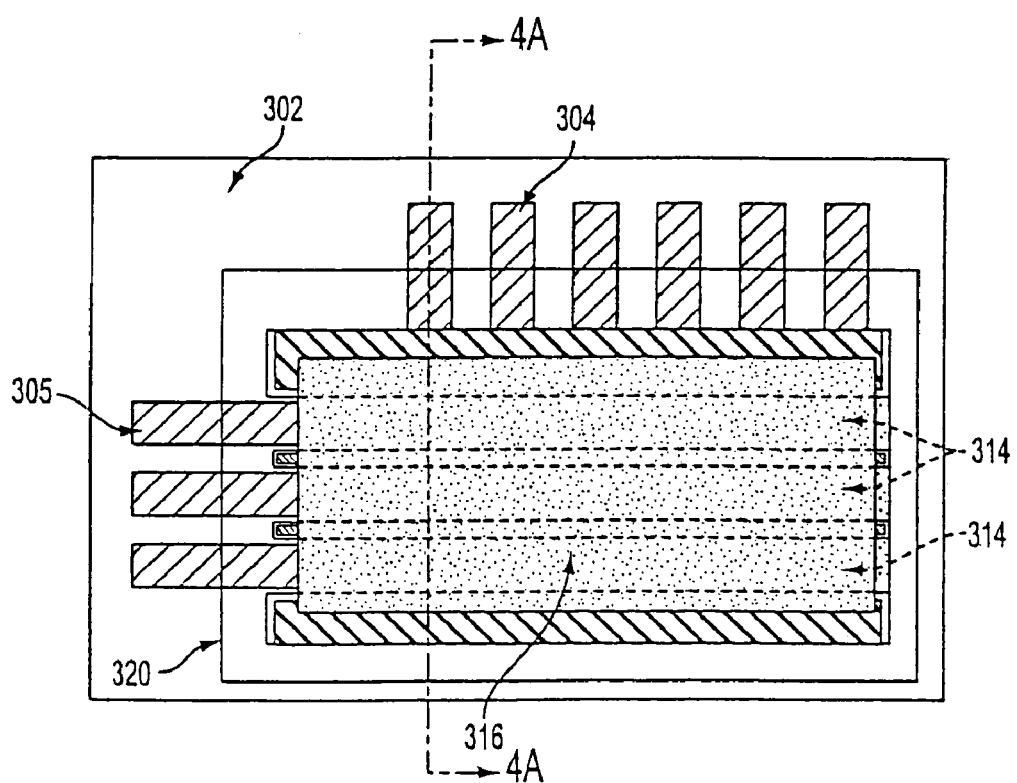

FIG. 3D shows that the OLED may be covered with a encapsulation or sealing 320. The encapsulation may be applied using a number of techniques including, for example spin-coating from solution, dip-coating, or application of a pre-formed sheet of material. The encapsulation may serve to provide physical rigidity to the OLED and to protect the device from environmental influences, such as air or moisture, for example. A transparent encapsulating material may be used if the encapsulating material covers a region of the device where light emission is desired. Because poly-siloxane is highly optically transmissive and tends not to interfere with light emission, poly-siloxane may be beneficial as a material for encapsulation of the OLED and for forming insulating structures such as the bank structure 306 and the insulating strips 310.

FIGS. 4A–B are cross sectional views showing details of the poly-siloxane insulating strips 310. The cross section is taken across a first electrode strip as indicated by arrows 4a in FIG. 3D. Referring to FIG. 4A, the insulating strips 310 may sit on the bank structure 306 between apertures 308, which expose the first electrode layer 304. The insulating strips 310 may have a base portion 406 and an overhanging portion 408. Vertical deposition of a layer, such as the second electrode layer, is depicted by arrows 404. The overhanging portions 408 of the insulating strips 310 assist in forming a break in the vertically deposited material at the locations 407 underneath the overhanging portion 408. Thus, electrical and physical isolation of the second electrode strips is enabled or enhanced. Alternative shapes for the insulating strips are possible, for example, a gradual overhanging incline, wherein the overhang increases from bottom to top without a distinct base portion. The use and construction of alternative shapes for insulating strips with overhanging portions is disclosed in European patent application No. EP 0910128A2.

In general, poly-siloxane insulating strips tend to provide the same advantages previously discussed for poly-siloxane insulating structures, including, for example, non-wetting behavior, the ability to be directly photo-patterned, and low retention of reactive chemicals and water. A further potential advantage of forming the insulating strips from poly-siloxane in constructing an OLED is that both positive and negative developing of the insulating structures can be achieved by adjusting the processing parameters (exposure UV light intensity, exposure time, development conditions) of the poly-siloxane, giving a high degree of control over the formation of the insulating structure. Thus, the overhanging portion 408 and base portion 406 of the insulating strips may be easily formed. Furthermore, it may be advantageous to have relatively sharp edges 409 on the insulating strips 310 in order to help break the vertically deposited material into strips. For other parts of insulating structures, such as for the sides of the bank structure shown at 106 in FIG. 1, smooth inclines may be desireable. Such smooth inclines help, for example, in confining the organic layers 110, 112 deposited from solution to the apertures 108. The high degree of control in formation of poly-siloxane insulating structures helps form such sharp edges and smoothly inclining structures.

FIG. 4B illustrates the desired deposition of the organic layers 410, 412 and the second electrode layer 316. The bank structure 306 and the insulating strips 310 may be deposited before the organic layers 410 and 412. It is desirable that the organic layers 410, 412 are deposited into the apertures of the bank structure 306. Next, the second electrode layer 316 may be deposited, desirably in a manner such that the second electrode strips 314 are formed between neighboring insulating strips 310 and waste material 318 is deposited on top of the insulating strips, so that breaks 320 are formed between the waste material 318 and the second electrode strips 314.

A problem may occur if organic material 410, 412 fills the location 407 underneath the overhanging portion 408 of the insulating strip 316. Such a filling may eliminate or substantially reduce the size of the overhang. Thus, when the second electrode layer 316 is deposited, the effect of the overhanging portion 408 in ensuring a break between the second electrode strips 314 and the waste material 318 may be reduced. An undesireable electrical bridge may be formed by the second electrode layer 316 where breaks 320 are desired, between electrode strips 314 and the waste material 318. Such bridging would prevent the electrical isolation of the second electrode strips 314 and proper functioning of the OLED. Other combinations of layers may form a similarly undesirable electrical bridge.

The use of poly-siloxane material may help eliminate electrical flaws such as the formation of bridges where breaks 320 should exist. For example, if the first organic layer 410 is deposited from aqueous solution, and the second organic layer 412 is deposited from non-polar solution, then the non-wetting character of poly-siloxane with respect to aqueous and non-polar solutions may help confine the organic layers 410, 412 to the apertures or away from the insulating strips 310. As a result, filling of the location 407 underneath the overhanging portion 408 by organic material and consequent electrical bridging tends to be less likely. Thus, inhibiting the formation of electrical bridges is another potential advantage of using poly-siloxane for the bank structure 306 or the insulating strips 310 in the OLED.

The term "insulating components" is used to refer to the three components which are the bank structure 306, the base portion 406 of the insulating strips 310 and the overhanging portion 408 of the insulating strips 310. Any combination of the insulating components may be formed of poly-siloxane. For example, the bank structure 306 and the base portion 406 of the insulating strips may be formed of poly-siloxane while the overhanging portion 408 may be formed of other material.

When multiple insulating components are formed of similar materials, it may be advantageous in terms of time and cost to pattern their structures substantially together during the same process. For example, instead of forming the base portion 406 and the overhanging portion 408 of the insulating strips 310 separately, they may be formed substantially together as a single piece during the same photo-patterning process. When formed as a single piece, the insulating strips may have a gradual overhanging incline, wherein the overhang increases from bottom to top without a distinct base portion. As another alternative, the bank structure 306 and the base portion 406 may be formed together during the same patterning process.

FIG. 5. is a cross-sectional view of an OLED having a bank structure formed of poly-siloxane. In this alternative construction, the first organic layer 510 is deposited before the bank structure 506 is formed. More particularly, the first electrode layer 504 may be deposited on the substrate 502, and a first organic layer 510 may be deposited on top of the first electrode layer. Then, a bank structure formed of poly-siloxane material 506 may be deposited. Next, a second organic layer 512 may be deposited into the apertures 508 of the bank structure 506. Then, the second electrode layer 514 is deposited. Alternatively, any number of organic layers may be deposited before or after the bank structure 506 is deposited. Depositing one or more of the organic layers before depositing the bank structure 506 may provide the advantage of inhibiting short circuits caused by residual organic material deposited with the organic layers. For example, if the first organic layer 510 were deposited after formation of the bank structure 506, part of the material forming the first organic layer may cling to the side of the bank structure aperture. Material may cling, for example, generally in the region indicated by arrows 516, thus protruding above the second organic layer 512 and making contact with the second electrode layer 514. Consequently, the second organic layer 512 could be short-circuited and non functional. Thus, forming the bank structure 506 after one or more of the organic layers is deposited may help inhibit such manufacturing flaws in the resulting OLEDs.

When insulating structures are deposited after some of the organic layers, poly-siloxane insulating structures may be advantageous in that non-polar solvents may be used to dissolve poly-siloxane during the photo-lithograpic patterning process. Thus, many organic materials, e.g. water-soluble conducting polymers such as PEDOT, may be unaffected by the solvents used to pattern poly-siloxane insulating structures. The curing temperatures of poly-siloxanes also are compatible with many organic materials, so that damage to the organic layers during curing of the insulating structures is inhibited through the use of poly-siloxane.

Alternative constructions for OLEDs may be used. For example, a non-transparent substrate, a non-transparent first electrode layer and a transparent second electrode layer may be used to allow photons to pass as visible emitted light through the transparent second electrode layer. The use of poly-siloxane insulating structures, such as bank structures and insulating strip structures, is compatible with such alternative OLED constructions.

Other embodiments are within the scope of the following claims.

What is claimed is:

1. A light-emitting device comprising:
a plurality of electrode layers, including an anode layer and a cathode layer;
an electro-luminescent organic material disposed between the anode and cathode layers; and
a poly-siloxane insulating structure defining apertures, wherein the electro-luminescent organic material is within the apertures, the poly-siloxane structure has a height greater than a thickness of the electro-luminescent organic material, the poly-siloxane structure surrounds the electro-luminescent organic material and the apertures correspond to a plurality of active, electro-luminescent pixels.

2. The device of claim 1 wherein at least one electrode layer is configured to independently address at least one aperture of the poly-siloxane insulating structure as an active, electro-luminescent pixel, and wherein the at least one electrode layer is coupled to a corresponding transistor.

3. The device of claim 1 wherein the poly-siloxane insulating structure forms a bank structure that insulates the plurality of active, electro-luminescent pixels from each other.

4. The device of claim 1 further comprising one or more insulating strips on the poly-siloxane insulating structure, and wherein at least one insulating strip comprises an overhanging portion or a base portion or both.

5. The device of claim 4 wherein the at least one insulating strip comprises poly-siloxane material in one or both of the overhanging portion and the base portion.

6. A method of fabricating a light-emitting device, the method comprising:
forming a first electrode layer on a substrate;
forming on the first electrode layer a poly-siloxane bank structure having apertures;
depositing from solution using wet-chemical techniques one or more organic layers into the apertures of the poly-siloxane bank structure, wherein at least one of the organic layers is electro-luminescent, the poly-siloxane bank structure has a height greater than a thickness of the electro-luminescent organic layers and the poly-siloxane bank structure surrounds the electro-luminescent organic material; and
forming a second electrode layer such that the one or more organic layers deposited into the apertures are disposed between the first and second electrode layers.

7. The method of claim 6 wherein the wet-chemical techniques comprise spin-casting, dip-coating, screen printing, flexo printing, or ink-jet printing.

8. The method of claim 6 wherein depositing one or more organic layers comprises depositing an electro-luminescent organic layer.

9. The method of claim 6 wherein forming on the first electrode layer a poly-siloxane bank structure includes patterning the poly-siloxane bank structure to separate the light-emitting device into a plurality of pixels.

10. The method of claim 6 wherein the poly-siloxane bank structure is formed before the one or more organic layers are deposited.

11. The method of claim 6 further comprising forming one or more insulating strips on the poly-siloxane bank structure.

12. The method of claim 11 wherein the one or more insulating strips are formed on the poly-siloxane bank structure between the apertures.

13. The method of claim 12 wherein the one or more insulating strips comprise an overhanging portion or a base portion or both.

14. The method of claim 13 wherein the one or more insulating strips comprise poly-siloxane in one or both of the overhanging portion and the base portion.

15. An organic light-emitting device (OLED) comprising:
a plurality of light-emitting elements, each light-emitting element comprising an electro-luminescent organic layer disposed between electrodes; and
at least one structure comprising poly-siloxane material, wherein the structure includes apertures and is configured to separate the plurality of light-emitting elements, wherein, prior to drying, the organic layer is initially a solution that includes an organic material and a solvent, the poly-siloxane structure is non-wetting to the organic material in an aperture, the poly-siloxane structure has a curing temperature below 250° C., the poly-siloxane structure has a height greater than a thickness of the organic material and the poly-siloxane structure surrounds the electro-luminescent organic material.

16. The OLED of claim 15 wherein the at least one structure comprises a poly-siloxane bank structure configured to separate the plurality of light-emitting elements from each other.

17. The OLED of claim 16 wherein the poly-siloxane bank structure includes apertures into which each of the light-emitting elements are arranged.

18. The OLED of claim 16 wherein the poly-siloxane bank structure physically and electrically insulates the light-emitting elements from each other.

19. The OLED of claim 15 further comprising one or more insulating strips on the at least one structure.

20. The OLED of claim 19 wherein the one or more insulating strips comprise an overhanging portion or a base portion or both.

21. The OLED of claim 20 wherein the one or more insulating strips comprise poly-siloxane material in one or both of the overhanging portion and the base portion.

22. The method of claim 6 wherein forming the poly-siloxane bank structure includes applying a photo-patternable poly-siloxane solution to the first electrode and exposing the poly-siloxane solution to light and developer solution.

23. The method of claim 6, wherein the poly-siloxane insulating structure is non-wettted by the solution.

24. The method of claim 6, further comprising drying the solution to form the organic layers.

25. A method of fabricating a light-emitting device, the method comprising:

forming a first electrode layer on a substrate;

applying a photo-patternable poly-siloxane solution to the first electrode and exposing the poly-siloxane solution to light and developer solution to form a poly-siloxane bank structure having apertures;

depositing from solution using wet-chemical techniques one or more organic layers into the apertures of the poly-siloxane bank structure, wherein at least one of the organic layers is electro-luminescent; and forming a second electrode layer such that the one or more organic layers deposited into the apertures are disposed between the first and second electrode layers.

* * * * *

UNITED STATES PATENT AND TRADEMARK OFFICE
CERTIFICATE OF CORRECTION

PATENT NO. : 7,160,633 B2
APPLICATION NO. : 10/705795
DATED : January 9, 2007
INVENTOR(S) : Elizabeth Tai and Matthias Stoessel Page 1 of 1

It is certified that error appears in the above-identified patent and that said Letters Patent is hereby corrected as shown below:

On the Title Page, (75) Inventors; replace inventor name:

"Matthias Stocssel" with
-- Matthias Stoessel --

Signed and Sealed this

First Day of April, 2008

JON W. DUDAS
*Director of the United States Patent and Trademark Office*